(12) United States Patent  
Kobayashi

(10) Patent No.: US 12,395,760 B2  
(45) Date of Patent: Aug. 19, 2025

(54) PHOTOELECTRIC CONVERSION DEVICE

(71) Applicant: CANON KABUSHIKI KAISHA, Tokyo (JP)

(72) Inventor: Hideo Kobayashi, Tokyo (JP)

(73) Assignee: CANONN KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/538,874

(22) Filed: Dec. 13, 2023

(65) Prior Publication Data

US 2024/0214704 A1    Jun. 27, 2024

(30) Foreign Application Priority Data

Dec. 23, 2022   (JP) ................ 2022-206424

(51) Int. Cl.
*H04N 25/77*    (2023.01)
*H04N 25/702*    (2023.01)
*H10F 39/00*    (2025.01)

(52) U.S. Cl.
CPC ........... *H04N 25/77* (2023.01); *H04N 25/702* (2023.01); *H10F 39/8037* (2025.01); *H10F 39/811* (2025.01)

(58) Field of Classification Search
CPC ............. H10F 39/1865; H10F 39/8037; H10F 39/811; A23B 99/00; H04N 25/709; H04N 25/78; H04N 25/77; H04N 25/702
See application file for complete search history.

(56) References Cited

U.S. PATENT DOCUMENTS

| | | |
|---|---|---|
| 2005/0151060 A1 | 7/2005 | Hashiguchi |
| 2008/0087823 A1 | 4/2008 | Murata |
| 2012/0299804 A1* | 11/2012 | Senda .................. H04N 25/30 345/55 |
| 2012/0320246 A1 | 12/2012 | Ikuma |
| 2019/0104262 A1* | 4/2019 | Kobayashi ........... H04N 25/779 |
| 2020/0404210 A1 | 12/2020 | Sekine |

FOREIGN PATENT DOCUMENTS

| | | |
|---|---|---|
| JP | 2005-198149 A | 7/2005 |
| JP | 2007-114089 A | 5/2007 |
| JP | 2011-182065 A | 9/2011 |
| JP | 2020-205544 A | 12/2020 |

* cited by examiner

*Primary Examiner* — Michael E Teitelbaum  
(74) *Attorney, Agent, or Firm* — VENABLE LLP

(57) ABSTRACT

A photoelectric conversion device including: a pixel; a signal line to which a signal is output from the pixel; a capacitive element having a first terminal and a second terminal, the first terminal being connected to the signal line; and a first control line. A variable potential is applied to the second terminal due to a change in a potential of the first control line.

24 Claims, 11 Drawing Sheets

PHOTOELECTRIC CONVERSION DEVICE

BACKGROUND OF THE INVENTION

Field of the Invention

The present disclosure relates to a photoelectric conversion device.

Description of the Related Art

Japanese Patent Application Laid-Open No. 2011-182065 discloses a solid-state imaging device including a pixel array and a column processing unit that processes signals output from the pixel array. In the solid-state imaging device disclosed in Japanese Patent Application Laid-Open No. 2011-182065, a low-pass filter including a capacitive element is arranged in a vertical signal line that transmits signals output from pixels.

There is a demand for further improvement in performance of a photoelectric conversion device in which a signal is transmitted from a pixel to a reading circuit via a signal line, as described in Japanese Patent Application Laid-Open No. 2011-182065.

SUMMARY OF THE INVENTION

It is an object of the present disclosure to provide a photoelectric conversion device configured to transmit a signal from a pixel to a reading circuit via a signal line, in which signal reading can be performed more suitably.

According to a disclosure of the present specification, there is provided a photoelectric conversion device including: a pixel; a signal line to which a signal is output from the pixel; a capacitive element having a first terminal and a second terminal, the first terminal being connected to the signal line; and a first control line. A variable potential is applied to the second terminal due to a change in a potential of the first control line.

Further features of the present invention will become apparent from the following description of exemplary embodiments with reference to the attached drawings.

DESCRIPTION OF THE EMBODIMENTS

Figure 1:
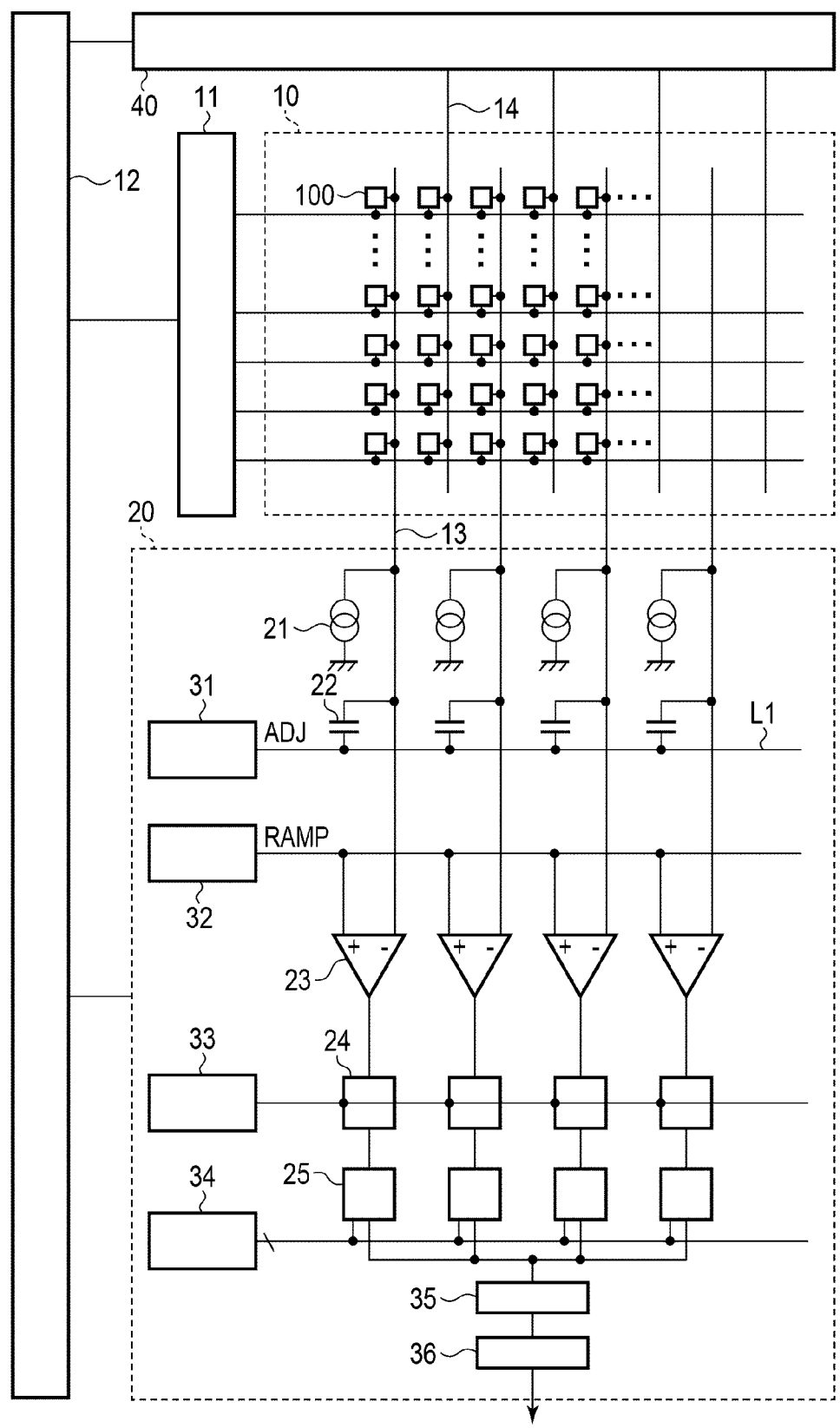
FIG. 1 is a block diagram illustrating a schematic configuration of a photoelectric conversion device according to a first embodiment.

Preferred embodiments of the present invention will now be described in detail in accordance with the accompanying drawings. In the drawings, the same or corresponding elements are denoted by the same reference numerals, and the description thereof may be omitted or simplified.

In the following first to sixth embodiments, an imaging device will be mainly described as an example of photoelectric conversion devices. However, the photoelectric conversion device of each embodiment is not limited to the imaging device, and can be applied to other photodetection devices based on photoelectric conversion. Examples of other photodetection devices include a ranging device and a photometry device. The ranging device may be, for example, a focus detection device, a distance measuring device using a time-of-flight (TOF), or the like. The photometry device may be a device that measures the amount of light incident on the device.

First Embodiment

FIG. 1 is a block diagram illustrating a schematic configuration of a photoelectric conversion device according to the present embodiment. The photoelectric conversion device includes a pixel array 10, a vertical scanning circuit 11, a control circuit 12, and reading circuits 20 and 40. Note that various circuits constituting the photoelectric conversion device may be formed in one or a plurality of semiconductor substrates.

The pixel array 10 includes a plurality of pixels 100 arranged to form a plurality of rows and a plurality of columns, each of the plurality of pixels 100 outputting a signal corresponding to incident light by photoelectric conversion. Each of the plurality of pixels 100 includes a photoelectric conversion unit that generates and accumulates signal charges based on incident light. A microlens and a color filter may be arranged on the pixel 100.

The photoelectric conversion device includes a potential adjustment circuit 31, a reference signal generation circuit 32, a counter 33, a horizontal scanning circuit 34, a processing circuit 35, and an output circuit 36.

The photoelectric conversion device has a column circuit corresponding to each column of the pixel array 10. The column circuit includes a current source 21, a capacitive element 22, a comparator 23, a first memory 24, and a second memory 25.

The column signal line 13 or 14 is provided for each column of the pixels 100, and pixels 100 in the same column output signals to the common column signal line 13 or 14. In the present embodiment, the column signal lines 13 of odd-numbered columns and the column signal lines 14 of even-numbered columns may be connected to different circuits. That is, the pixels 100 in the odd-numbered columns are read by the lower reading circuit 20 in FIG. 1 through the column signal lines 13, and the pixels 100 in the even-numbered columns are read by the upper reading circuit 40 in FIG. 1 through the column signal lines 14. The number of column signal lines arranged in one column of the pixels 100 is not limited to one, and a plurality of column signal lines may be arranged. Also, although four column circuits are illustrated in FIG. 1, a larger number of column circuits are actually arranged. Typically, the number of column circuits is several hundreds to several thousands. Since the circuit configuration of the reading circuit 40 is substantially the same as that of the reading circuit 20, illustration thereof is omitted in FIG. 1. In the following description, the description of the reading circuit 40 may be omitted as appropriate.

The control circuit 12 controls the vertical scanning circuit 11 and the reading circuits 20 and 40. The control circuit 12 supplies a control signal or the like that instructs the operation timing of each unit in the vertical scanning circuit 11 and the reading circuits 20 and 40.

The vertical scanning circuit 11 includes a shift register, a gate circuit, a buffer circuit, and the like. The vertical scanning circuit 11 outputs control signals to the pixels 100 based on a vertical synchronization signal, a horizontal synchronization signal, a clock signal, and the like, and performs scanning to sequentially output signals from the pixels 100 on a row basis.

A column circuit of an odd-numbered column including the current source 21, the capacitive element 22, the comparator 23, the first memory 24, and the second memory 25 processes a signal output from the pixel 100 via the column signal line 13. Specifically, the column circuit amplifies a signal in the column signal line 13 and performs analog-to-digital conversion (AD conversion). The current source 21 is connected to the column signal line 13 and functions as a load circuit that supplies a driving current for outputting a signal from the pixel 100. The comparator 23 compares the signal of the column signal line 13 with a reference signal. The first memory 24 and the second memory 25 hold count signals according to the comparison result of the comparator 23.

The potential adjustment circuit 31 is connected to a control line L1 (first control line), and supplies a variable potential to the control line L1. A first terminal of each capacitive element 22 is connected to the column signal line 13, and a second terminal of each capacitive element 22 is connected to the control line L1. Thus, the potential of the control line L1 is changed by the control of the potential adjustment circuit 31, whereby a variable potential is applied to the second terminal of the capacitive element 22. Thus, the potential adjustment circuit 31 can control the potential of the column signal line 13. Hereinafter, a potential output from the potential adjustment circuit 31 to the control line L1 may be referred to as a control signal ADJ.

The comparator 23 includes a differential amplifier circuit and the like, and has an inverting input node, a non-inverting input node, and an output node. The inverting input node is connected to the column signal line 13, and a reference signal RAMP is input from the reference signal generation circuit 32 to the non-inverting input node. The comparator 23 compares a signal from the pixel 100 with the reference signal RAMP, and outputs a comparison signal indicating the comparison result from the output node.

The reference signal generation circuit 32 generates the reference signal RAMP (ramp signal) whose potential changes depending on time based on a clock pulse output from the control circuit 12 or a clock generation circuit (not illustrated). The reference signal generation circuit 32 may be configured using various methods such as a capacitor charge/discharge method, a DAC method, and a current steering method. The reference signal RAMP may be an upslope in which the potential thereof rises with time, or may be a downslope in which the potential thereof decreases with time. The reference signal RAMP may include a plurality of slope waveforms having different potential change rates per unit time.

The counter 33 counts a clock pulse output from the control circuit 12 or a clock generation circuit (not illustrated), and counts up or down a count signal that is a digital signal having a predetermined number of bits. The control circuit 12 or the clock generation circuit includes an oscillation circuit or the like, and supplies the clock pulse to the counter 33. The counter 33 starts counting clock pulses at the same time that the potential of the reference signal RAMP from the reference signal generation circuit 32 starts to vary, and outputs a clock signal to the first memory 24 through a wiring. When the level of the comparison signal output from the comparator 23 changes, the first memory 24 holds the value of the clock signal that is input at that time. Thereby, AD conversion of the signal from the pixel 100 is performed. Then, the signal of the first memory 24 is transferred to the second memory 25.

The horizontal scanning circuit 34 includes a shift register, a gate circuit, a buffer circuit, and the like. The horizontal scanning circuit 34 sequentially outputs control signals to the second memories 25 of the corresponding columns via the wirings arranged at corresponding columns based on the pulses of the control signal supplied from the control circuit 12. Thereby, the count values held in the second memories 25 are sequentially transferred to the processing circuit 35 on a column basis. The pulse of the control signal is a signal indicating the start timing of horizontal transfer of signals from the second memories 25 to the processing circuit 35.

The processing circuit 35 includes a digital signal processor and a memory, and has a function of performing processing such as digital correlated double sampling. The memory in the processing circuit 35 is used for temporarily storing signals for the digital correlated double sampling. The signals held in the processing circuit 35 are output to the outside of the photoelectric conversion device via the output circuit 36 by a method such as a low voltage differential signaling (LVDS) in accordance with the control of the control circuit 12.

FIG. 1 illustrates an example in which the count signal is input from the counter 33 common to the plurality of first memories 24, but the circuit configuration is not limited thereto. For example, a plurality of counters 33 may be arranged so as to correspond to the plurality of first memories 24, respectively. In this case, a common clock pulse is input to the plurality of counters 33, and each of the plurality of counters 33 generates a count signal based on the common clock pulse.

Figure 2:
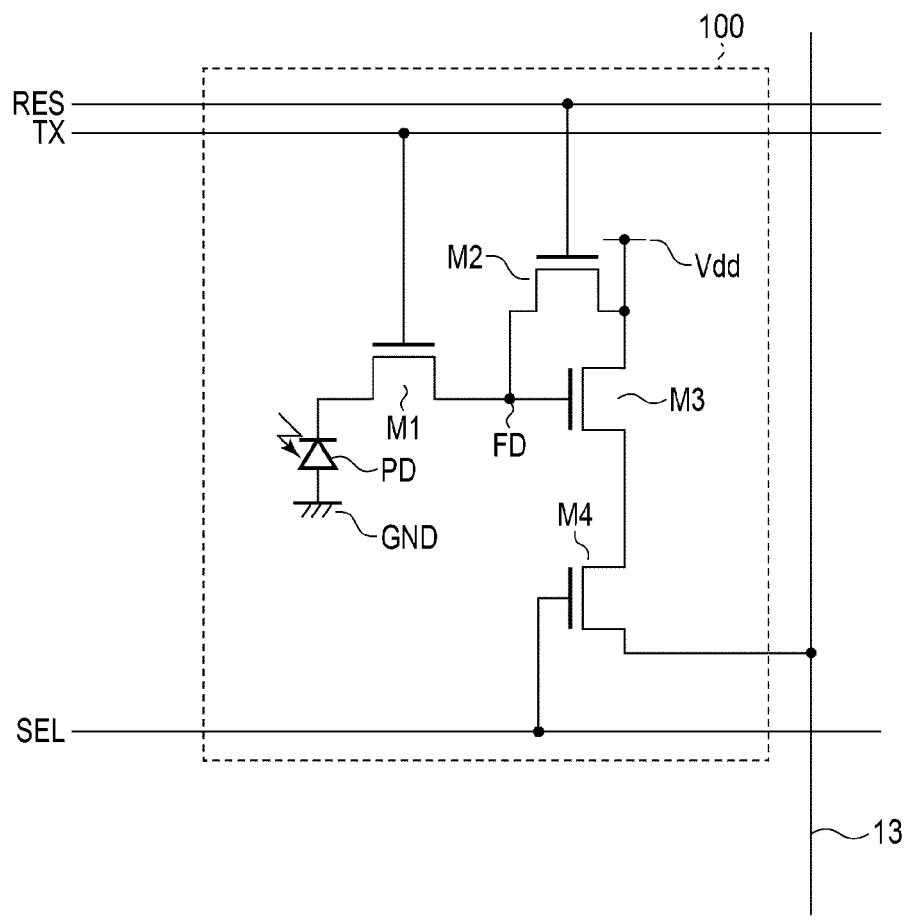
FIG. 2 is a circuit diagram of a pixel according to the first embodiment.

FIG. 2 is a circuit diagram of the pixel 100 according to the present embodiment. The pixel 100 may include a photoelectric conversion unit PD, a transfer transistor M1, a floating diffusion FD, a reset transistor M2, a source follower transistor M3, and a selection transistor M4. In the following description, these transistors are N-type metal oxide semiconductor (MOS) transistors unless otherwise specified. A reference potential (for example, a ground potential GND) is supplied to a back gate node (not illustrated) of these transistors. Drain nodes of the reset transistor M2 and the source follower transistor M3 are connected to a node having a power supply potential Vdd. Note that a P-type MOS transistor may be used instead of the N-type MOS transistor. In this case, a potential of a control signal applied to a gate node of the P-type MOS transistor is inverted with respect to a potential of a control signal applied to a gate node of the N-type MOS transistor.

The photoelectric conversion unit PD is, for example, a photodiode, and generates charges by photoelectric conversion of incident light and accumulates the generated charges. Note that instead of the photodiode, a configuration in which a photoelectric effect is generated, such as a photoelectric conversion film of an organic material, a photogate, or the like, may be used. The photoelectric conversion unit PD is provided with a microlens, and light condensed by the microlens is incident on the photoelectric conversion unit PD. By employing a buried photodiode as the photoelectric conversion unit PD, dark current noise can be reduced.

The transfer transistor M1 is provided corresponding to the photoelectric conversion unit PD, and a control signal TX is applied to a gate node of the transfer transistor M1. When the control signal TX becomes the high level, charges generated and accumulated by light reception in the photoelectric conversion unit PD are transferred to the floating diffusion FD via the transfer transistor M1.

The power supply potential Vdd is applied to the drain node of the source follower transistor M3. A source potential of the source follower transistor M3 changes according to the amount of charges transferred to the floating diffusion FD.

The selection transistor M4 is provided between the source follower transistor M3 and the column signal line 13. The selection transistors M4 of the pixels 100 in a plurality of rows of the same column are connected to a common column signal line 13. The current source 21 and the source follower transistor M3 constitute a source follower. A control signal SEL is supplied to a gate node of the selection transistor M4. When the control signal SEL becomes the high level, the selection transistor M4 outputs a signal corresponding to the source potential of the source follower transistor M3 to the column signal line 13.

A source node of the reset transistor M2 is connected to the floating diffusion FD, and the power supply potential Vdd is applied to a drain node of the reset transistor M2. A control signal RES is applied to a gate node of the reset transistor M2. When the control signal RES becomes the high level, the reset transistor M2 resets a potential of the floating diffusion FD.

Figure 3:
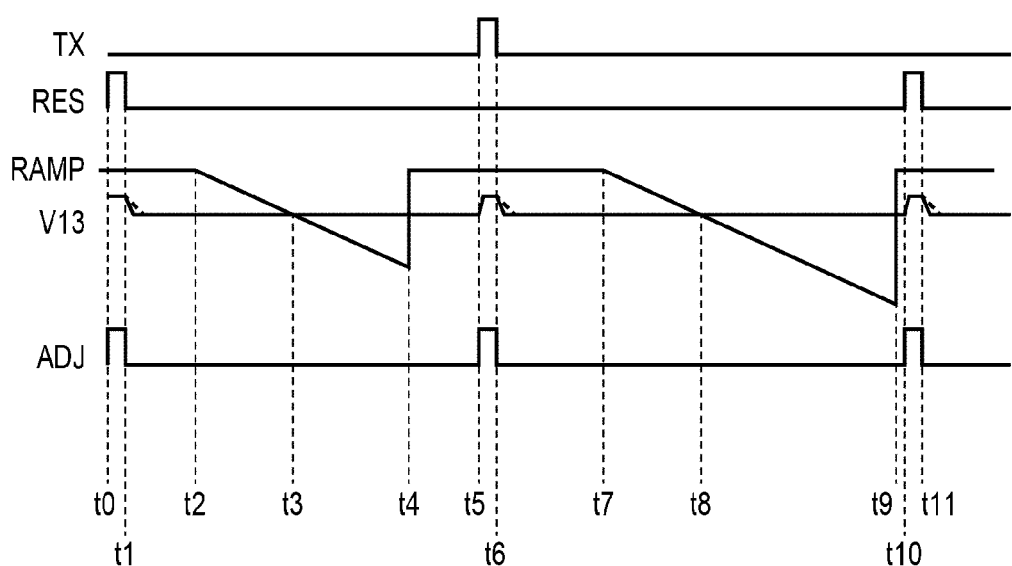
FIG. 3 is a timing chart illustrating an operation of the photoelectric conversion device according to the first embodiment.

FIG. 3 is a timing chart illustrating an operation of the photoelectric conversion device according to the present embodiment. FIG. 3 illustrates a reading method for one row of the photoelectric conversion device. FIG. 3 illustrates the potentials of the control signals TX, RES, ADJ, the reference signal RAMP, and the column signal line 13. A solid line at "V13" in FIG. 3 indicates the potential of the column signal line 13.

During a period from time t0 to time t1, the control signal RES becomes the high level. Thus, the reset transistor M2 is turned on, and the floating diffusion FD is reset. Accordingly, the potential of the column signal line 13 becomes a reset level. In the period from the time t0 to the time t1, the control signal ADJ is at the high level.

At the time t1, the control signal RES becomes the low level. Thus, the reset transistor M2 is turned off. At this time, the potential of the floating diffusion FD decreases due to the influence of the transition of the control signal RES through the parasitic capacitance between the gate node and the source node of the reset transistor M2. Accordingly, the potential of the column signal line 13 also decreases. When the potential of the column signal line 13 decreases, it takes time to settle the potential. The settling time may limit the operating speed of the photoelectric conversion device.

Therefore, in the present embodiment, the control signal ADJ changes to the low level at the time t1. The change in the potential of the control signal ADJ lowers the potential of the column signal line 13 through the capacitive element 22. Thereby, the potential drop of the column signal line 13 when the reset transistor M2 is turned off is assisted, and the settling time is shortened. This makes it possible to speed up the operation of the photoelectric conversion device.

At time t2, the potential of the reference signal RAMP starts to vary. In addition, at the time t2, count-up of the count signal output from the counter 33 is started.

At time t3, the potential of the reference signal RAMP becomes equal to the potential of the column signal line 13, and the output signal of the comparator 23 changes. The counter 33 measures time from the time t2 at which the count-up starts to the time t3 at which the output signal of the comparator 23 changes. The first memory 24 holds the count signal from the counter 33. Thereby, the AD conversion of the reset level is performed. The AD conversion result is transferred from the first memory 24 to the second memory 25 and then transferred to the processing circuit 35 under the control of the horizontal scanning circuit 34. Thereafter, at time t4, the reference signal RAMP is reset and returns to the original potential.

During a period from time t5 to time t6, the control signal TX becomes the high level. As a result, the transfer transistor M1 turns on, and charges generated by photoelectric conversion are transferred from the photoelectric conversion unit PD to the floating diffusion FD. During the period from the time t5 to the time t6, the potential of the floating diffusion FD varies due to the transition of the control signal TX, so that the potential of the column signal line 13 also varies. Since FIG. 3 illustrates a waveform corresponding to dark state, in which no light is incident on the photoelectric conversion unit PD, after the time t6, the potential of the column signal line 13 is settled to the reset level similar to that at the time t3. When light is incident on the photoelectric conversion unit PD, the potential of the floating diffusion FD decreases according to the amount of generated charges, and the potential of the column signal line 13 also decreases. In the period from the time t5 to the time t6, the control signal ADJ is at the high level.

At the time t6, the control signal TX becomes the low level. Thereby, the transfer transistor M1 is turned off. At this time, the potential of the floating diffusion FD decreases due to the influence of the transition of the control signal TX via the parasitic capacitance between the gate node and the source node of the transfer transistor M1. Accordingly, the potential of the column signal line 13 also decreases. This settling time may also be a factor that limits the operating speed of the photoelectric conversion device.

Therefore, in the present embodiment, the control signal ADJ changes to the low level at the time t6. The change in the potential of the control signal ADJ lowers the potential of the column signal line 13 through the capacitive element 22. Thereby, the potential drop of the column signal line 13 when the transfer transistor M1 is turned off is assisted, and the settling time is shortened. This makes it possible to speed up the operation of the photoelectric conversion device.

At time t7, the potential of the reference signal RAMP starts to vary. In addition, at the time t7, count-up of the count signal output from the counter 33 is started.

At time t8, the potential of the reference signal RAMP becomes equal to the potential of the column signal line 13, and the output signal of the comparator 23 changes. The counter 33 measures time from the time t7 at which the count-up starts to the time t8 at which the output signal of the comparator 23 changes. The first memory 24 holds the count signal from the counter 33. Thereby, the AD conversion of an optical signal level is performed. The AD conversion result is transferred from the first memory 24 to the second memory 25 and then transferred to the processing circuit 35 under the control of the horizontal scanning circuit 34. The processing circuit 35 performs a digital correlated double sampling processing for calculating a difference between the optical signal level and the reset level. Thereafter, at time t9, the reference signal RAMP is reset and returns to the original potential. Since the processing of time t10 and time t11 is the same as the processing of the time t0 and the time t1, the description thereof will be omitted.

In the present embodiment, the potential of the control signal ADJ changes when the control signal RES transitions at the time t1 and the control signal TX transitions at the time t6. This assists the change in the potential of the column signal line 13 due to the transition of the control signals RES and TX. A broken line at "V13" in FIG. 3 schematically illustrates a comparative example in which the potential of the control signal ADJ is not changed. As can be understood from the comparison between the solid line and the broken line at "V13" in FIG. 3, the effect of reducing the settling time can be obtained by changing the potential of the control signal ADJ in accordance with the transition of the control signals RES and TX. Therefore, according to the present embodiment, the operation speed of the photoelectric conversion device can be increased.

As described above, according to the present embodiment, in a photoelectric conversion device configured to transmit a signal from a pixel to a reading circuit via a signal line, a photoelectric conversion device capable of more suitably reading a signal is provided.

In FIG. 3, the control signal ADJ is a binary digital signal in which the high level (first potential) is the power supply potential and the low level (second potential) is the ground potential, but the potential of the control signal ADJ may be other than these. For example, at least one of the high level and the low level may be a potential between the power supply potential and the ground potential. Further, the control signal ADJ may be variable to three or more values. The control signal ADJ may be an analog signal whose potential can continuously vary. By employing such a control signal ADJ, the potential of the column signal line 13 can be finely adjusted. On the other hand, the configuration of FIG. 3 in which the control signal ADJ is the binary digital signal is effective from the viewpoint of circuit scale reduction because the configuration of the potential adjustment circuit 31 for generating the control signal ADJ is simplified.

Second Embodiment

A photoelectric conversion device according to a second embodiment will be described. In the description of the present embodiment, portions having the same functions as those of the first embodiment are denoted by the same reference numerals, and detailed description thereof may be omitted or simplified.

The photoelectric conversion device of the present embodiment is a modified example in which the configuration of the pixel 100 of FIG. 2 of the first embodiment is changed. Other points are substantially the same as those in the first embodiment, and thus description thereof is omitted.

Figure 4:
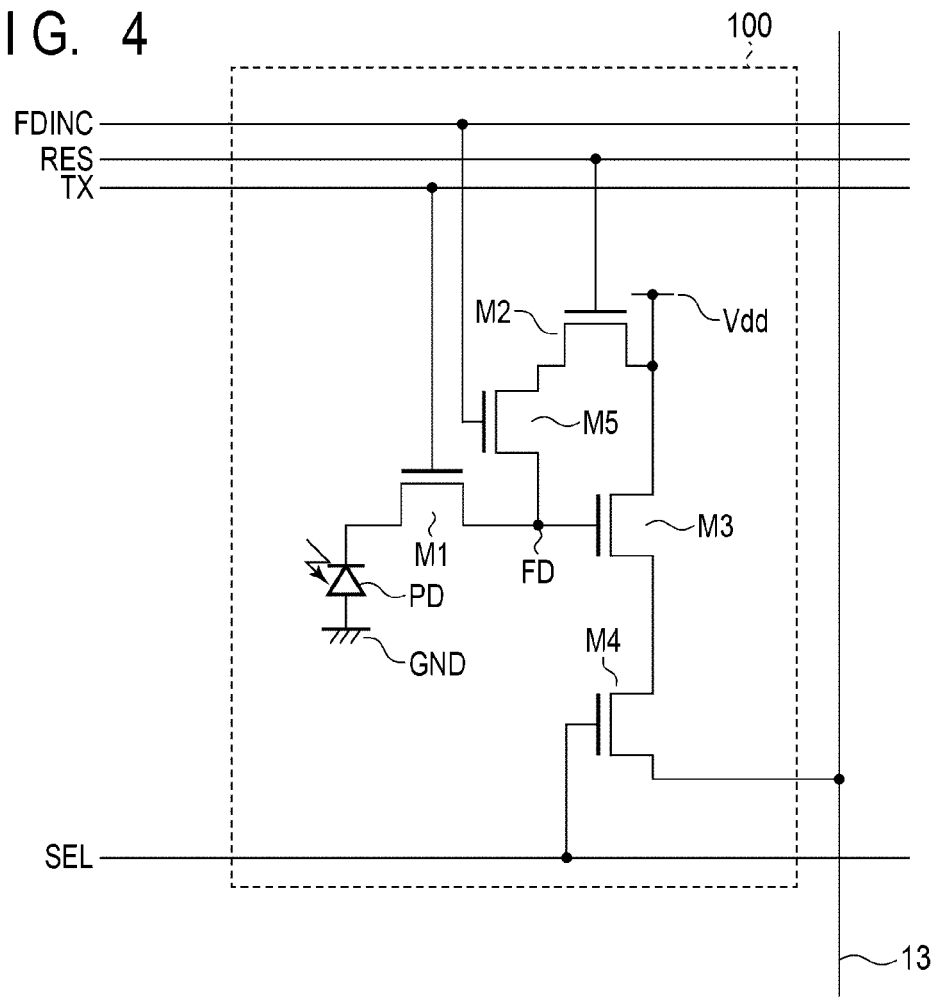
FIG. 4 is a circuit diagram of a pixel according to a second embodiment.

FIG. 4 is a circuit diagram of the pixel 100 according to the present embodiment. The pixel 100 further includes a capacitance switching transistor M5 in addition to the configuration of the pixel 100 illustrated in FIG. 2. A source node of the capacitance switching transistor M5 is connected to the floating diffusion FD, and a drain node of the capacitance switching transistor M5 is connected to the source node of the reset transistor M2. A control signal FDINC is supplied to a gate node of the capacitance switching transistor M5. When the control signal FDINC becomes the high level, the capacitance switching transistor M5 is turned on, and the parasitic capacitance of the floating diffusion FD increases. Thus, the gain of the signal output from the pixel 100 can be changed by changing the capacitance of the floating diffusion FD. For example, when the amount of incident light is large, a signal can be read out with a low gain by turning on the capacitance switching transistor M5. Thus, in the present embodiment, the dynamic range can be enlarged.

Figure 5:
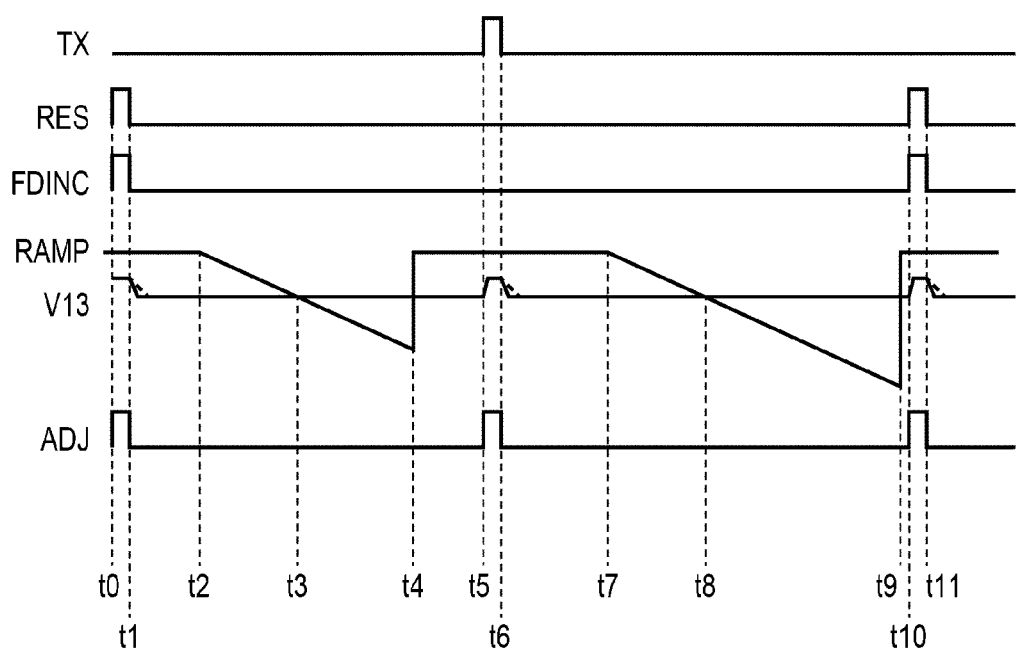
FIG. 5 is a timing chart illustrating an operation of a photoelectric conversion device according to the second embodiment.

FIG. 5 is a timing chart illustrating an operation of the photoelectric conversion device according to the present embodiment. In FIG. 5, the control signal FDINC is added to the timing chart of FIG. 3. Operations other than the control signal FDINC are the same as those in FIG. 3. The operation timings of the control signal FDINC are the same as those of the control signal RES. That is, the timing chart illustrated in FIG. 5 illustrates an example in which the control signal FDINC is at the low level and reading is performed in a high gain state.

As illustrated in FIG. 5, also in the present embodiment, the potential of the control signal ADJ changes when the control signals RES and FDINC transition at the time t1 and the control signal TX transition at the time t6. This assists the change in the potential of the column signal line 13 due to the transition of the control signals RES, FDINC, and TX. As can be understood from the comparison between the solid line and the broken line at "V13" in FIG. 5, by changing the potential of the control signal ADJ in accordance with the transition of the control signals RES, FDINC, and TX, the effect of reducing the settling time can be obtained. Therefore, also in the present embodiment, the operation speed of the photoelectric conversion device can be increased as in the first embodiment.

As described above, according to the present embodiment, in a photoelectric conversion device configured to transmit a signal from a pixel to a reading circuit via a signal line, a photoelectric conversion device capable of more suitably reading a signal is provided.

Third Embodiment

A photoelectric conversion device according to a third embodiment will be described. In the description of the present embodiment, portions having the same functions as those of the first embodiment or the second embodiment are denoted by the same reference numerals, and detailed description thereof may be omitted or simplified.

The photoelectric conversion device of the present embodiment is a modified example in which the configuration of the reading circuit 20 of FIG. 1 of the first embodiment is changed. Other points are substantially the same as those in the first embodiment, and thus description thereof is omitted.

Figure 6:
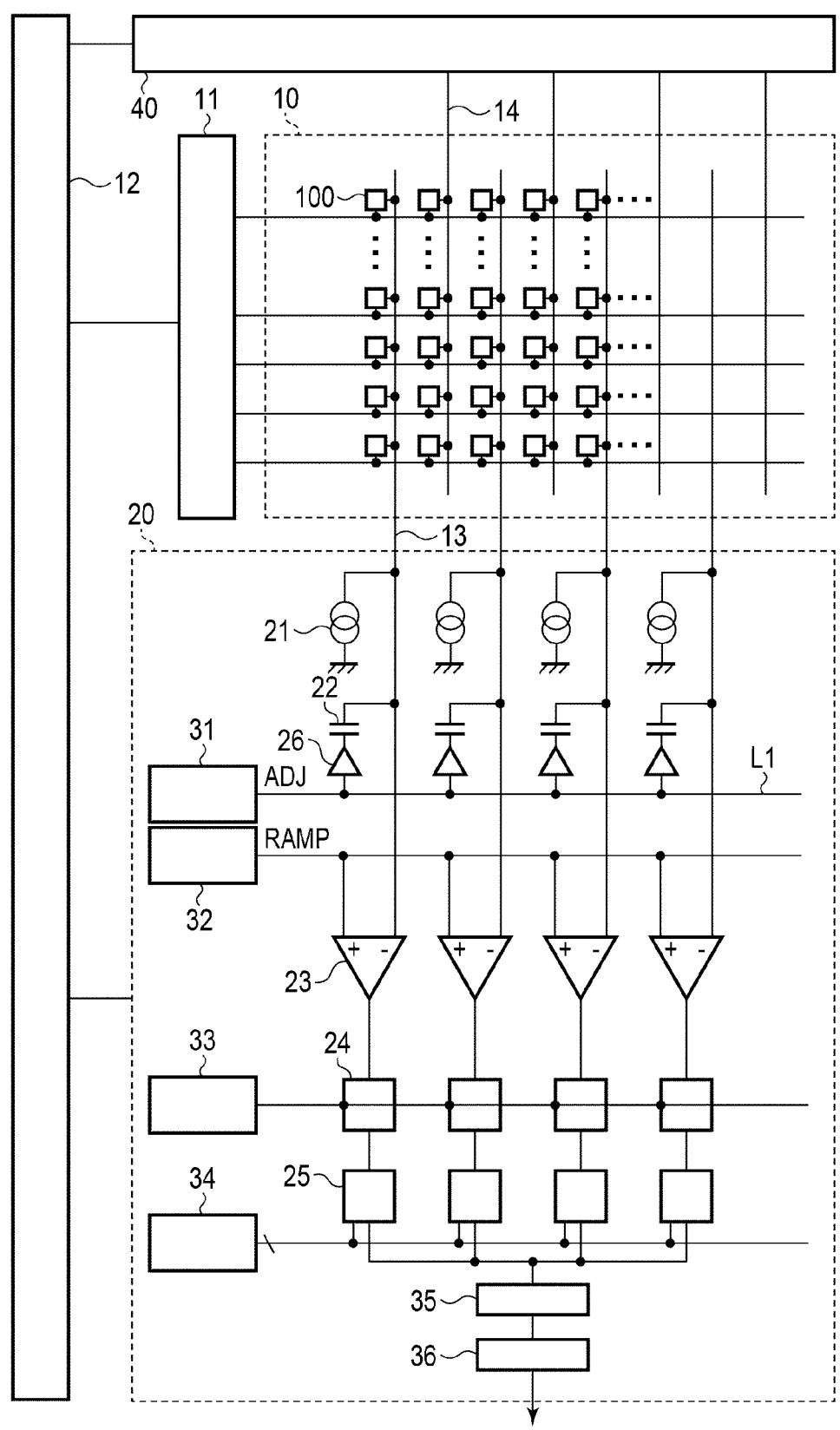
FIG. 6 is a block diagram illustrating a schematic configuration of a photoelectric conversion device according to a third embodiment.

FIG. 6 is a block diagram illustrating a schematic configuration of the photoelectric conversion device according to the present embodiment. The column circuit of the reading circuit 20 further includes a buffer 26 (first buffer). An input terminal of the buffer 26 is connected to the control line L1, and an output terminal of the buffer 26 is connected to the second terminal of the capacitive element 22.

When the potential of the column signal line 13 varies, this potential variation may be transmitted (kicked back) to the control line L1 via the capacitive element 22. In this case, the potential variation of the column signal line 13 of a certain column is transmitted to the column signal line 13 of another column, whereby interference between columns may occur. In the present embodiment, since the buffer 26 is arranged between the capacitive element 22 and the control line L1, interference between the columns can be reduced.

In the present embodiment, since the driving force is improved by the buffer 26, the potential of the column signal line 13 can be controlled even when the capacitance value of the capacitive element 22 is small. Therefore, the area occupied by the capacitive element 22 can be reduced.

Due to the influence of the parasitic resistance and the parasitic capacitance of the wiring, rounding (a waveform in which a delay occurs in a rising edge or a falling edge) may occur in a waveform when the potential of the control signal ADJ transitions. Since the degree of the rounding of the waveform varies from column to column, the rounding of the waveform of the control signal ADJ may cause the inter-column characteristic difference. In the present embodiment, since the buffer 26 is arranged between the capacitive element 22 and the control line L1, the inter-column characteristic difference that may occur as described above can be reduced.

As described above, according to the present embodiment, in a photoelectric conversion device configured to transmit a signal from a pixel to a reading circuit via a signal line, a photoelectric conversion device capable of more suitably reading a signal is provided.

In FIG. 6, the buffer 26 is arranged corresponding to each column, but the buffer 26 may not be arranged in some columns. For example, the buffers 26 may be arranged at a rate of one per two columns. In this case, although the interference between the columns increases as compared with the case where the buffer 26 is arranged corresponding to each column, the occupied area of the buffer 26 is reduced because the number of the buffers 26 decreases.

When the control signal ADJ is an analog signal whose potential can vary continuously, the buffer 26 may be an analog circuit such as a source follower or a voltage follower. When the control signal ADJ is a digital signal whose potential can vary discontinuously, the buffer 26 may be a logic circuit. Examples of the logic circuit include a NOT gate, a NOR gate, a NAND gate, and a tri-state buffer. From the viewpoint of reducing the power consumption of the buffer 26, the control signal ADJ is preferably a digital signal.

Fourth Embodiment

A photoelectric conversion device according to a fourth embodiment will be described. In the description of the present embodiment, portions having the same functions as those of the first to third embodiments are denoted by the same reference numerals, and detailed description thereof may be omitted or simplified.

The photoelectric conversion device of the present embodiment is a modified example in which the configuration of the reading circuit 20 of FIG. 6 of the third embodiment is changed. Other points are substantially the same as those of the third embodiment, and thus description thereof is omitted.

Figure 7:
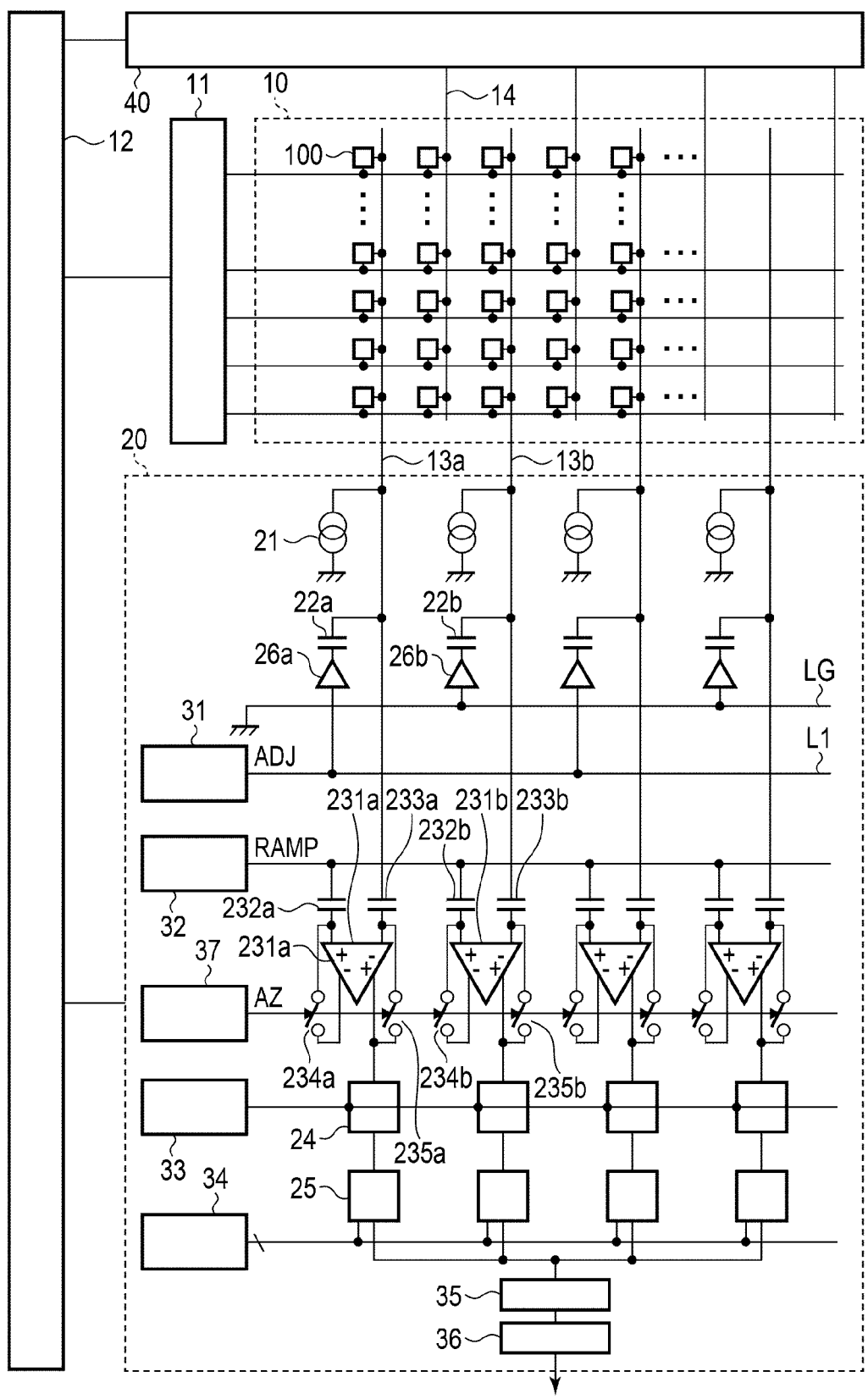
FIG. 7 is a block diagram illustrating a schematic configuration of a photoelectric conversion device according to a fourth embodiment.

FIG. 7 is a block diagram illustrating a schematic configuration of a photoelectric conversion device according to the present embodiment. In the third embodiment, the input terminal of the buffer 26 of each column in the reading circuit 20 is connected to the control line L1. On the other hand, in the present embodiment, the input terminals of the buffers 26a (first buffer) of some columns (first column) are connected to the control line L1 (first control line), and the input terminals of the buffers 26b (second buffer) of other columns (second column) are connected to the ground line LG. The ground line LG has a ground potential. The potential of the ground line LG is not limited to the ground potential, and may be a fixed potential.

As illustrated in FIG. 7, "a" may be added to a reference numeral of the element of the column in which the input terminal of the buffer 26a is connected to the control line L1, and "b" may be added to a reference numeral of the element of the column in which the input terminal of the buffer 26b is connected to the ground line LG. Since the configuration and function of both circuits are substantially the same except for the connection of the input terminals of the buffers 26a and 26b, elements with "a" are mainly described below, and the description of elements with "b" may be omitted.

In the present embodiment, the configuration of the comparator 23 of the first to third embodiments is changed. The reading circuit 20 of the present embodiment further includes a clamping control circuit 37. The column circuit of the present embodiment includes a comparator 231a, capacitive elements 232a and 233a, and switches 234a and 235a instead of the comparator 23.

The comparator 231a includes a differential amplifier circuit and the like, and has an inverting input node (first input terminal), a non-inverting input node (second input terminal), an inverting output node, and a non-inverting output node (output terminal). A first terminal of the capacitive element 233a is connected to a column signal line 13a, and a second terminal of the capacitive element 233a is connected to the inverting input node of the comparator 231a and a first terminal of the switch 235a. A second terminal of the switch 235a is connected to the non-inverting output node of the comparator 231a and the first memory 24. A first terminal of the capacitive element 232a is connected to the reference signal generation circuit 32, and a second terminal of the capacitive element 232a is connected to the non-inverting input node of the comparator 231a and a first terminal of the switch 234a. A second terminal of the switch 234a is connected to the inverting output node of the comparator 231a.

The clamping control circuit 37 outputs a control signal AZ that controls the switches 234a and 235a of each column to be on or off based on a pulse of the control signal supplied from the control circuit 12. Since the switches 234a and 235a are controlled by the common control signal AZ, the states of the switches 234a and 235a are switched simultaneously.

Figure 8:
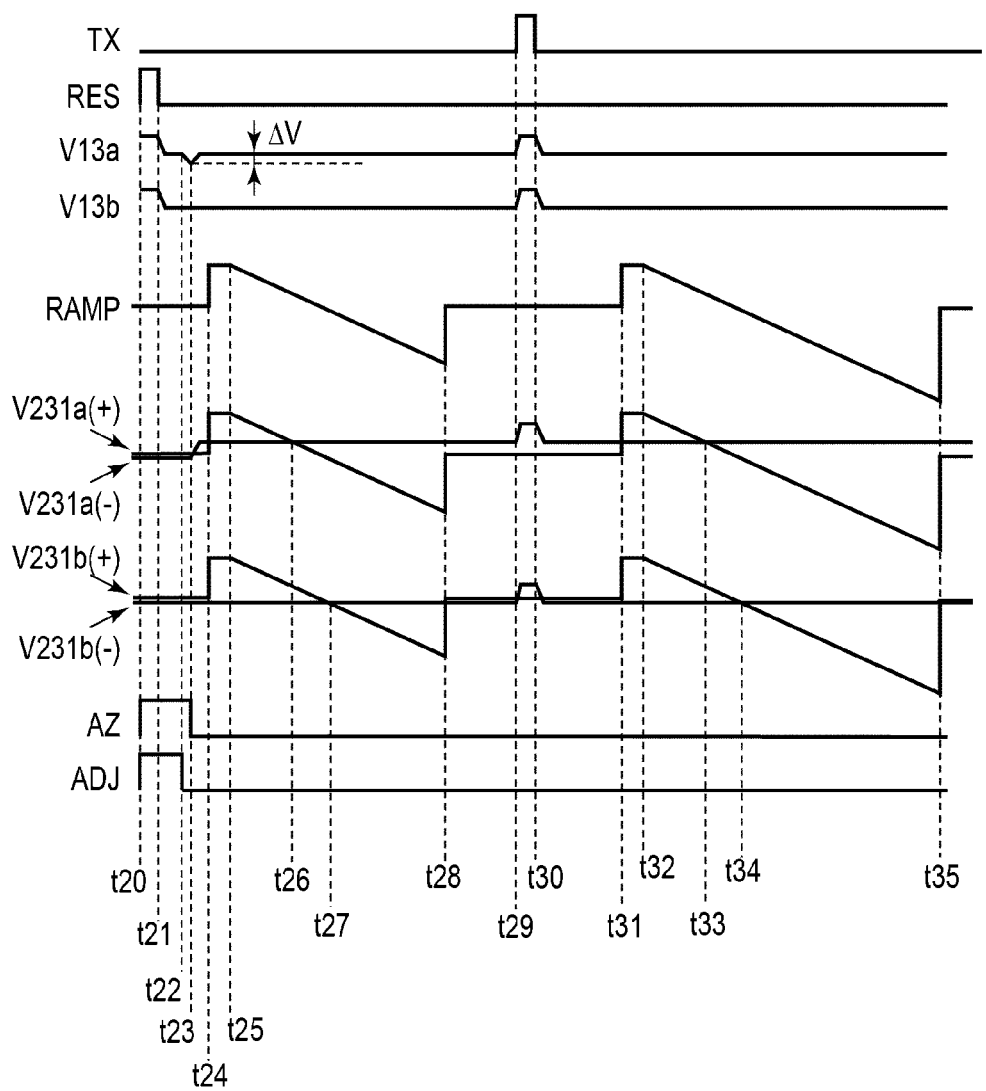
FIG. 8 is a timing chart illustrating an operation of the photoelectric conversion device according to the fourth embodiment.

FIG. 8 is a timing chart illustrating an operation of the photoelectric conversion device according to the present embodiment. FIG. 8 illustrates a reading method for one row of the photoelectric conversion device. FIG. 8 illustrates the potentials of the control signals TX, RES, AZ, and ADJ, the reference signal RAMP, and the column signal lines 13a and 13b. In FIG. 8, "V13a" and "V13b" indicate potentials of the column signal lines 13a and 13b, respectively. FIG. 8 illustrates potentials of input nodes of the comparators 231a and 231b. In FIG. 8, "V231a(+)" and "V231a(−)" indicate the potential of the non-inverting input node of the comparator 231a and the potential of the inverting input node of the comparator 231a, respectively. In FIG. 8, "V231b(+)" and "V231b(−)" indicate the potential of the non-inverting input node of the comparator 231b and the potential of the inverting input node of the comparator 231b, respectively.

During a period from time t20 to time t21, the control signal RES becomes the high level. Thus, the reset transistor M2 is turned on, and the floating diffusion FD is reset. Accordingly, the potentials of the column signal lines 13a and 13b are set to the reset level. At this time, the control signals ADJ and AZ are at the high level.

At the time t21, the control signal RES becomes the low level. Thus, the reset transistor M2 is turned off. As described in the first embodiment, according to this operation, the potentials of the column signal lines 13a and 13b also decrease.

At time t22, the control signal ADJ becomes the low level. The change in the potential of the control signal ADJ lowers the potential of the column signal line 13a via the buffer 26a and the capacitive element 22a. On the other hand, since the control signal ADJ is not input to the buffer 26b, the potential of the column signal line 13b does not change.

During a period from the time t20 to time t23, the control signal AZ is at the high level. Thereby, the switches 234b and 235b are turned on. The non-inverting input node and the inverting input node of the comparator 231b are reset to the reset level, and the reset level of the column signal line 13b is clamped at the time t23. That is, at the time t23, the potential of the first terminal of the capacitive element 233b is the reset level of the column signal line 13b, and the potential of the second terminal of the capacitive element 233b is the reset level of the comparator 231b. At the time t23, the potential of the first terminal of the capacitive element 232b is a reference level of the reference signal RAMP, and the potential of the second terminal of the capacitive element 232b is the reset level of the comparator 231b. When the control signal AZ becomes the low level at the time t23, the switches 234b and 235b are turned off, and the reference level of the reference signal RAMP and the reset level of the column signal line 13b are clamped to the capacitive elements 232b and 233b, respectively.

The same clamping operation is performed on the comparator 231a side. However, at the time t23, the potential of the column signal line 13a is lower than the reset level by ΔV. Therefore, at the time t23, the potential of the first terminal of the capacitive element 233a is lower than the potential of the first terminal of the capacitive element 233b by ΔV, and this potential is clamped by the capacitive element 233a. Since there is a difference between the potential clamped by the capacitive element 233a and the potential clamped by the capacitive element 233b, the timing at which the output signal of the comparator 231a changes and the timing at which the output signal of the comparator 231b changes are different in an AD conversion operation described later.

During a period from the time t23 to time t24, the potential of the column signal line 13a rises by ΔV and returns to the reset level. Thereby, the potential of the inverting input node of the comparator 231a rises.

At the time t24, the potential of the reference signal RAMP is set to a start potential. At time t25, the potential of the reference signal RAMP starts to vary. At time t25, count-up of the count signal output from the counter 33 is started.

At time t26, the potential of the inverting input node of the comparator 231a becomes equal to the potential of the non-inverting input node of the comparator 231a, and the output signal of the comparator 231a changes. After that, at time t27, the potential of the inverting input node of the comparator 231b becomes equal to the potential of the non-inverting input node of the comparator 231b, and the output signal of the comparator 231b changes. The first memory 24 holds the count signal from the counter 33. Thereby, the AD conversion of the reset level is performed. The AD conversion result is transferred from the first memory 24 to the second memory 25 and then transferred to the processing circuit 35 under the control of the horizontal scanning circuit 34. Thereafter, at time t28, the reference signal RAMP is reset and returns to the original potential. As described above, at the time of the AD conversion of the reset level, the time t26, which is the timing at which the output signal of the comparator 231a changes, and the time t27, which is the timing at which the output signal of the comparator 231b changes, are different from each other. As a result, the time at which a current flows due to a change in the output signal of the comparator 231a and the time at which a current flows due to a change in the output signal of the comparator 231b are not at the same time. Therefore, the peak current caused by the changes of the output signals of the comparators 231a and 231b can be reduced.

During a period from time t29 to time t30, the control signal TX becomes the high level. As a result, the transfer transistor M1 is turned on, and charges generated by photoelectric conversion are transferred from the photoelectric conversion unit PD to the floating diffusion FD.

At time t31, the potential of the reference signal RAMP is set to the start potential. At time t32, the potential of the reference signal RAMP starts to vary. At time t32, count-up of the count signal output from the counter 33 is started.

At time t33, the potential of the inverting input node of the comparator 231a becomes equal to the potential of the non-inverting input node of the comparator 231a, and the output signal of the comparator 231a changes. Then, at time t34, the potential of the inverting input node of the comparator 231b becomes equal to the potential of the non-inverting input node of the comparator 231b, and the output signal of the comparator 231b changes. The first memory 24 holds the count signal from the counter 33. Thereby, the AD conversion of the optical signal level is performed. At the time of AD conversion of the optical signal level, the time t33, which is the timing at which the output signal of the comparator 231a changes, and the time t34, which is the timing at which the output signal of the comparator 231b changes, are different from each other. Therefore, the peak current caused by the changes in the output signals of the comparators 231a and 231b can be reduced.

The AD conversion result of the optical signal is transferred from the first memory 24 to the second memory 25 and then transferred to the processing circuit 35 under the control of the horizontal scanning circuit 34. The processing circuit 35 performs a digital correlated double sampling processing for calculating a difference between the optical signal level and the reset level. The difference between the timings at which the output signals of the comparator 231a and the comparator 231b change is superimposed on both signals of the reset level and the optical signal level by the same amount. Therefore, the output signal after the digital correlated double sampling has no influence of the above-described difference between the timings at which the output signals change. Thereafter, at time t35, the reference signal RAMP is reset and returns to the original potential.

In a configuration in which AD conversion is performed on a column basis, when output signals of a plurality of comparators change at the same time, a peak current when the output signals change may increase. In the present embodiment, a potential based on the control signal ADJ is applied to the column signal lines 13a of some columns, and a potential (ground potential) different from that is applied to the column signal lines 13b of the other columns. Thereby, at the time of AD conversion, the timing at which the output signal of the comparator 231a changes and the timing at which the output signal of the comparator 231b changes are different from each other. Therefore, the peak current caused by the changes of the output signals of the comparators 231a and 231b can be reduced.

As described above, according to the present embodiment, in a photoelectric conversion device configured to transmit a signal from a pixel to a reading circuit via a signal line, a photoelectric conversion device capable of more suitably reading a signal is provided.

Fifth Embodiment

A photoelectric conversion device according to a fifth embodiment will be described. In the description of the present embodiment, portions having the same functions as those of the first to fourth embodiments are denoted by the same reference numerals, and detailed description thereof may be omitted or simplified.

The photoelectric conversion device of the present embodiment is a modified example in which the configuration of the reading circuit 20 of FIG. 7 of the fourth embodiment is changed. Other points are substantially the same as those of the fourth embodiment, and thus description thereof is omitted.

In the fourth embodiment, the input terminals of the buffers 26a in some columns are connected to the control line L1, and the input terminals of the buffers 26b in the other columns are connected to the ground line LG. On the other hand, in the present embodiment, the input terminals of the buffers 26b (second buffer) of the other columns are connected to a control line L2 (second control line) having a potential different from that of the control line L1.

Figure 9:
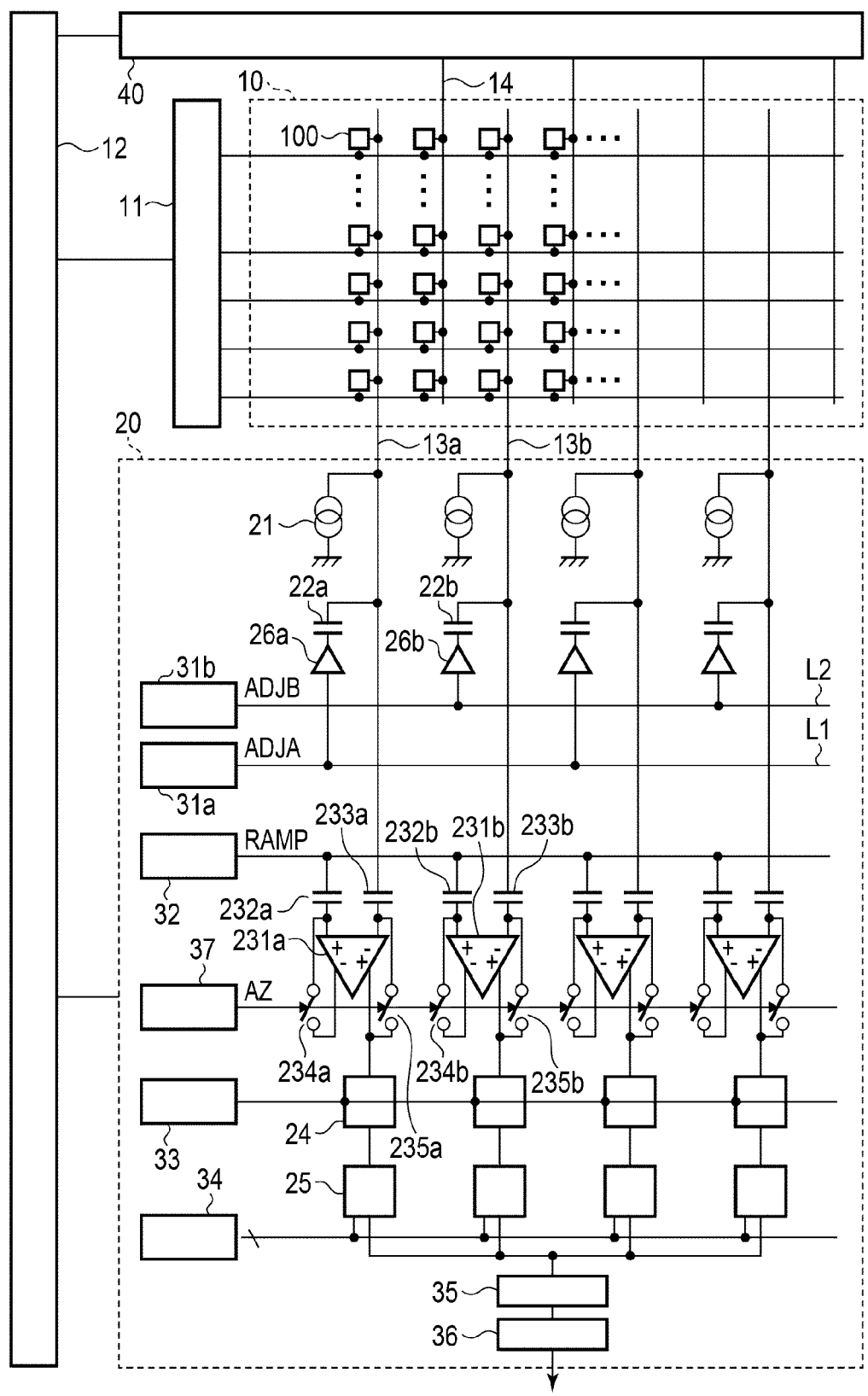
FIG. 9 is a block diagram illustrating a schematic configuration of a photoelectric conversion device according to a fifth embodiment.

FIG. 9 is a block diagram illustrating a schematic configuration of a photoelectric conversion device according to the present embodiment. The reading circuit 20 includes two potential adjustment circuits 31a and 31b instead of the potential adjustment circuit 31. The potential adjustment circuit 31a outputs a control signal ADJA to the control line L1. The potential adjustment circuit 31b outputs a control signal ADJB to the control line L2. The control signal ADJA and the control signal ADJB may have potentials different from each other.

Figure 10:
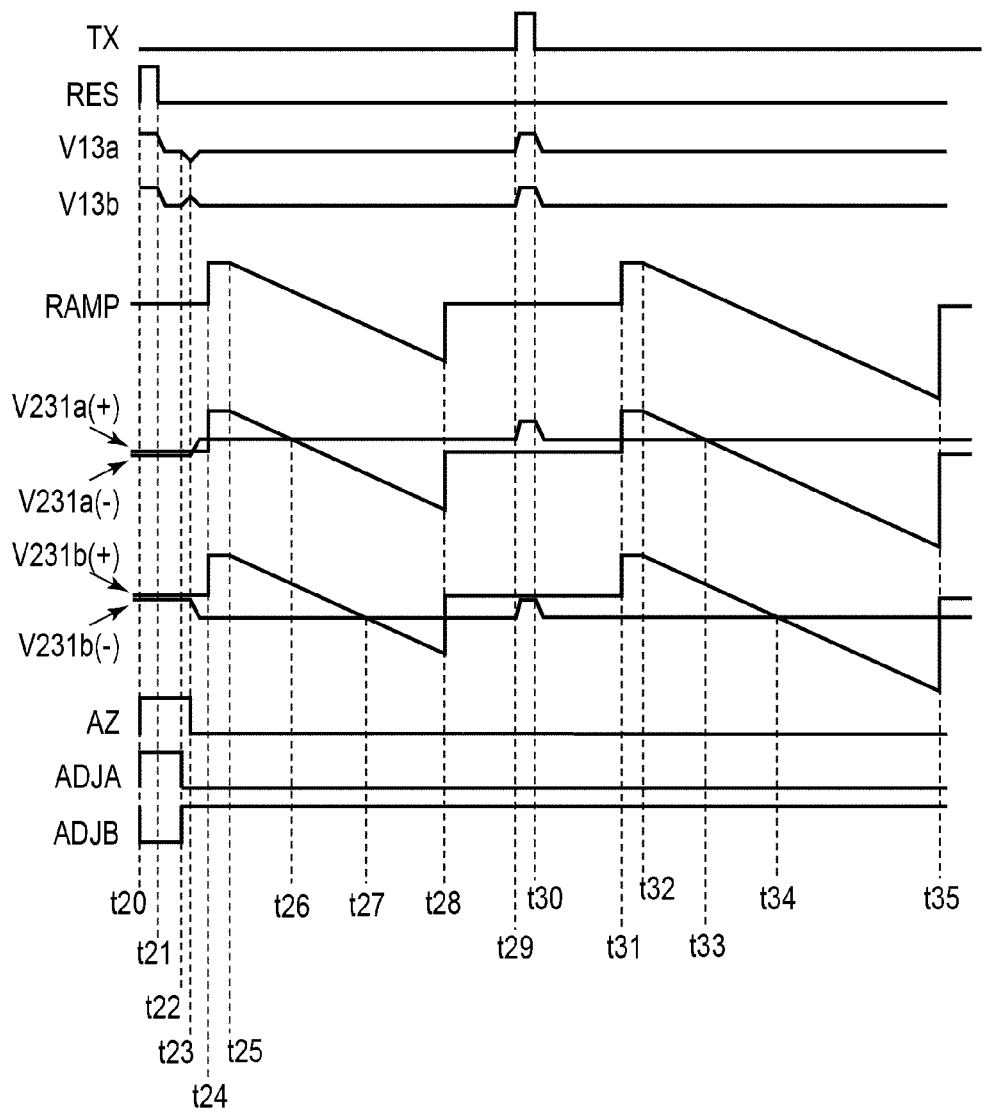
FIG. 10 is a timing chart illustrating an operation of the photoelectric conversion device according to the fifth embodiment.

FIG. 10 is a timing chart illustrating an operation of the photoelectric conversion device according to the present embodiment. FIG. 10 illustrates a reading method for one row of the photoelectric conversion device. FIG. 10 illustrates control signals ADJA and ADJB instead of the control signal ADJ illustrated in FIG. 8.

As illustrated in FIG. 10, the control signal ADJA is the same signal as the control signal ADJ illustrated in FIG. 8. The control signal ADJB has a polarity opposite to that of the control signal ADJA. As a result, after the time t23, in addition to the potential of the inverting input node of the comparator 231a, the potential of the inverting input node of the comparator 231b also changes. This potential change is opposite in polarity to the potential of the inverting input node of the comparator 231a. Thereby, the timing (the time t26 and the time t33) at which the output signal of the comparator 231a changes becomes earlier than that of the fourth embodiment. The timing (the time t27 and the time t34) at which the output signal of the comparator 231b changes becomes later than that of the fourth embodiment. The other points are similar to those in the fourth embodiment.

In the present embodiment, as in the fourth embodiment, the peak current caused by the changes of the output signals of the comparators 231a and 231b can be reduced. Further, also in the present embodiment, as in the fourth embodiment, the output signal after the digital correlated double sampling is not affected by the difference between the timings at which the output signals change.

In the present embodiment, the effect of reducing the variation of the power supply potential of the pixel array 10 is obtained as compared with the fourth embodiment. Hereinafter, this effect will be described in detail. At the time t22, the potential of the column signal line 13a decreases. Thus, in the pixel 100 connected to the column signal line 13a, since the gate-source voltage of the source follower transistor M3 increases, the current flowing through the source follower transistor M3 temporarily increases. Accordingly, the current flowing from the power supply line to the column signal line 13a increases. This current increase may cause the power supply potential of the pixel array 10 to vary and cause image quality degradation. In the present embodiment, the potential of the column signal line 13b rises at the time t22. Thus, in the pixel 100 connected to the column signal line 13b, since the gate-source voltage of the source follower transistor M3 decreases, the current flowing through the source follower transistor M3 temporarily decreases. Therefore, the current flowing from the power supply line to the column signal line 13b decreases. Since the current increase in the column signal line 13a is offset from the current decrease in the column signal line 13b, in the present embodiment, the effect of reducing the variation of the power supply potential of the pixel array 10 is obtained. Thus, deterioration of image quality due to variation in power supply potential can be suppressed.

As described above, according to the present embodiment, in a photoelectric conversion device configured to transmit a signal from a pixel to a reading circuit via a signal line, a photoelectric conversion device capable of more suitably reading a signal is provided.

From the viewpoint of reducing the inter-column characteristic difference, it is desirable that the buffer 26a and the buffer 26b have the same circuit configuration. In order for the buffer 26a and the buffer 26b to have the same circuit configuration, it is desirable that both the control signal ADJA and the control signal ADJB be analog signals or digital signals. From the viewpoint of reducing the power consumption of the buffers 26a and 26b as described above, both the control signals ADJA and ADJB are preferably digital signals.

Sixth Embodiment

A photoelectric conversion device according to a sixth embodiment will be described. In the description of the present embodiment, portions having the same functions as those of the first to fifth embodiments are denoted by the same reference numerals, and detailed description thereof may be omitted or simplified.

The photoelectric conversion device of the present embodiment is a modified example in which the configurations of the pixel array 10 and the reading circuit 20 of FIG.

9 of the fifth embodiment are changed. Other points are substantially the same as those of the fifth embodiment, and thus description thereof is omitted.

Figure 11:
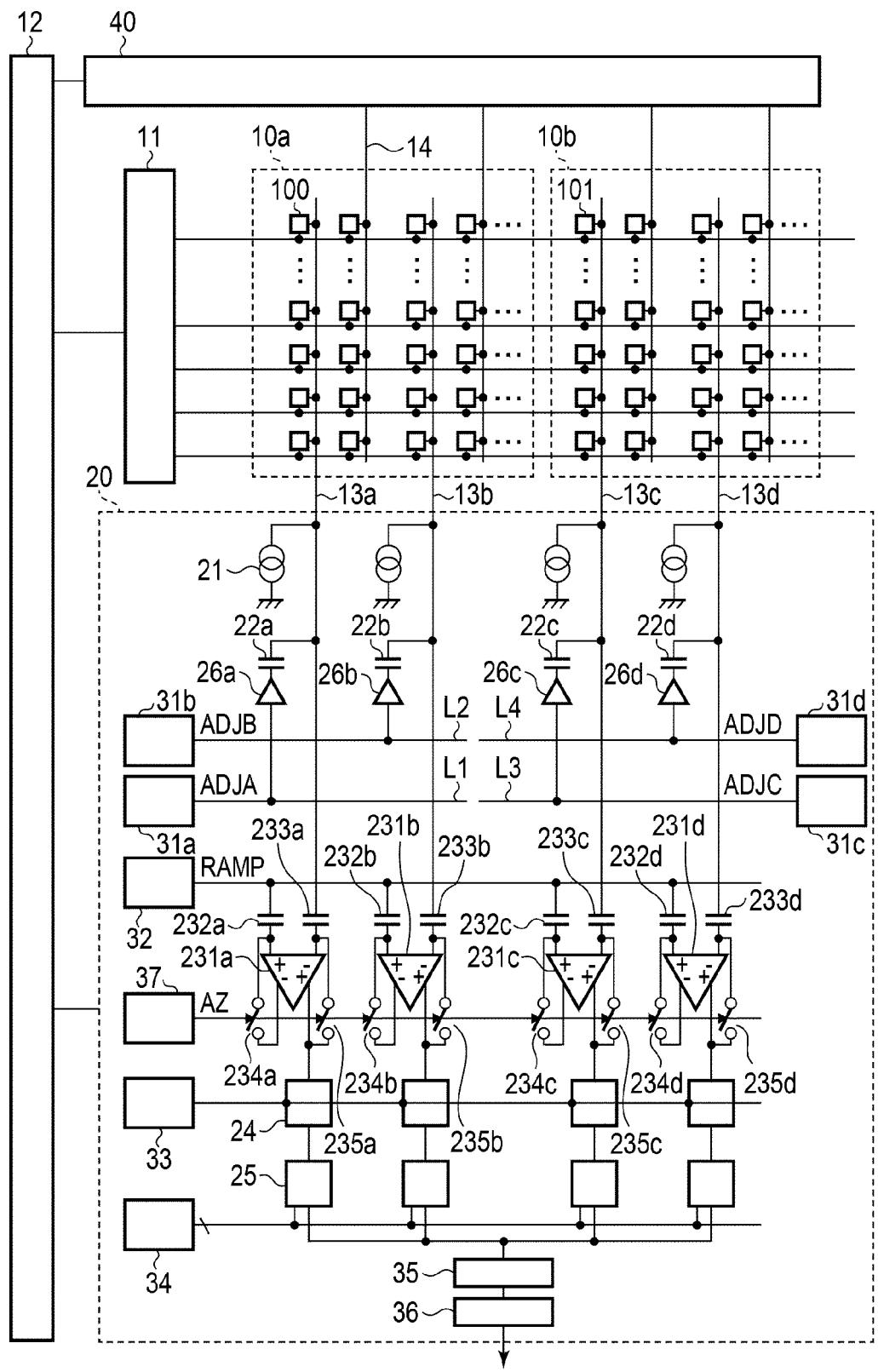
FIG. 11 is a block diagram illustrating a schematic configuration of a photoelectric conversion device according to a sixth embodiment.

FIG. 11 is a block diagram illustrating a schematic configuration of a photoelectric conversion device according to the present embodiment. In the present embodiment, the pixel array 10 of the other embodiments is configured by two of an effective pixel array 10a and a light-shielded pixel array 10b. The effective pixel array 10a includes the pixels 100 (effective pixel) each including the photoelectric conversion unit PD (photoelectric conversion element) that output a signal according to incident light by photoelectric conversion. The light-shielded pixel array 10b includes light-shielded pixels 101 each including the photoelectric conversion unit PD that is light-shielded. The signal output from the light-shielded pixel 101 can be used for correction of an output signal from the pixel 100.

In the present embodiment, similarly to the fifth embodiment, the input terminals of the buffers 26a (first buffer) of some columns (first column) of the effective pixel array 10a are connected to the control line L1 (first control line), and the input terminals of the buffers 26b of the other columns are connected to the control line L2. In the present embodiment, input terminals of buffers 26c (second buffer) of some columns (second column) of the light-shielded pixel array 10b are connected to a control line L3 (second control line), and input terminals of buffers 26d of the other columns are connected to a control line L4.

As illustrated in FIG. 11, "c" may be added to a reference numeral of the element of the column in which the input terminal of the buffer 26c is connected to the control line L3, and "d" may be added to a reference numeral of the element of the column in which the input terminal of the buffer 26d is connected to the control line L4. The configurations and functions of both circuits are substantially the same except for the connection of the input terminals of the buffers 26c and 26d.

The reading circuit 20 further includes potential adjustment circuits 31c and 31d. The potential adjustment circuit 31c outputs a control signal ADJC to the control line L3. The potential adjustment circuit 31d outputs a control signal ADJD to the control line L4. The control lines L3 and L4 corresponding to the light-shielded pixel array 10b may be wirings electrically isolated from the control lines L1 and L2 corresponding to the effective pixel array 10a. Thereby, the control signals ADJC and ADJD can have different potentials with respect to the control signals ADJA and ADJB.

Thus, the control signals ADJA, ADJB, ADJC, and ADJD can be set such that the inversion timings of comparators 231c and 231d corresponding to the light-shielded pixel array 10b are made earlier than those of the comparators 231a and 231b corresponding to the effective pixel array 10a. In this case, interference of signals from the effective pixel to the light-shielded pixel can be reduced.

An example of the control signals ADJA, ADJB, ADJC, and ADJD capable of realizing such an operation will be described. As such an example, both the operation timings of the control signals ADJC and ADJD are the same as those of the control signal ADJA of FIG. 10, and both the operation timings of the control signals ADJA and ADJB are the same as those of the control signal ADJB of FIG. 10. In this case, for the same reason as in the fifth embodiment, the timing at which the output signals of the comparators 231c and 231d corresponding to the light-shielded pixel array 10b change is earlier than the timing at which the output signals of the comparators 231a and 231b corresponding to the effective pixel array 10a change. As a result, interference of signals from the effective pixel to the light-shielded pixel can be reduced.

Note that for example, a driving method in which the potential of the control signal ADJB is not changed by always making the potential of the control signal ADJB constant may be applied. In this case, the timing at which the output signal of the comparator 231a changes is later than the timing at which the output signal of the comparator 231b changes. Further, the timings at which the output signals of the comparators 231c and 231d change are earlier than the timings at which the output signals of the comparators 231a and 231b change. As a result, similarly to the above, the interference of signals from the effective pixel to the light-shielded pixel can be reduced. Further, by shifting the timing at which the output signal of the comparator 231a changes from the timing at which the output signal of the comparator 231b changes, the interference between columns in the effective pixel array 10a can be reduced.

As described above, according to the present embodiment, in a photoelectric conversion device configured to transmit a signal from a pixel to a reading circuit via a signal line, a photoelectric conversion device capable of more suitably reading a signal is provided.

From the viewpoint of reducing the characteristic difference between the effective pixel array 10a and the light-shielded pixel array 10b, it is desirable that the buffers 26a, 26b, 26c, and 26d have the same circuit configuration. In order for the buffers 26a, 26b, 26c, and 26d to have the same circuit configuration, all of the control signals ADJA, ADJB, ADJC, and ADJD are preferably analog signals or digital signals. From the viewpoint of reducing the power consumption of the buffers 26a, 26b, 26c, and 26d, all of the control signals ADJA, ADJB, ADJC, and ADJD are preferably digital signals.

The design of the column circuits of each column may be different from each other. For example, the following examples are given. The capacitance values of the capacitive element 22a and the capacitive element 22b may be different from each other. The capacitance values of the capacitive element 22a and the capacitive element 22c may be different from each other. The element sizes of the buffer 26a and the buffer 26b may be different from each other. The element sizes of the buffer 26a and the buffer 26c may be different from each other. The driving forces of the buffer 26a and the buffer 26b may be different from each other. The driving forces of the buffer 26a and the buffer 26c may be different from each other.

Further, in the present embodiment, the amplitudes of the plurality of control signals may be different from each other. For example, the amplitudes of the control signal ADJA and the control signal ADJB may be different from each other. For example, the amplitudes of the control signal ADJA and the control signal ADJC may be different from each other.

Seventh Embodiment

Figure 12:
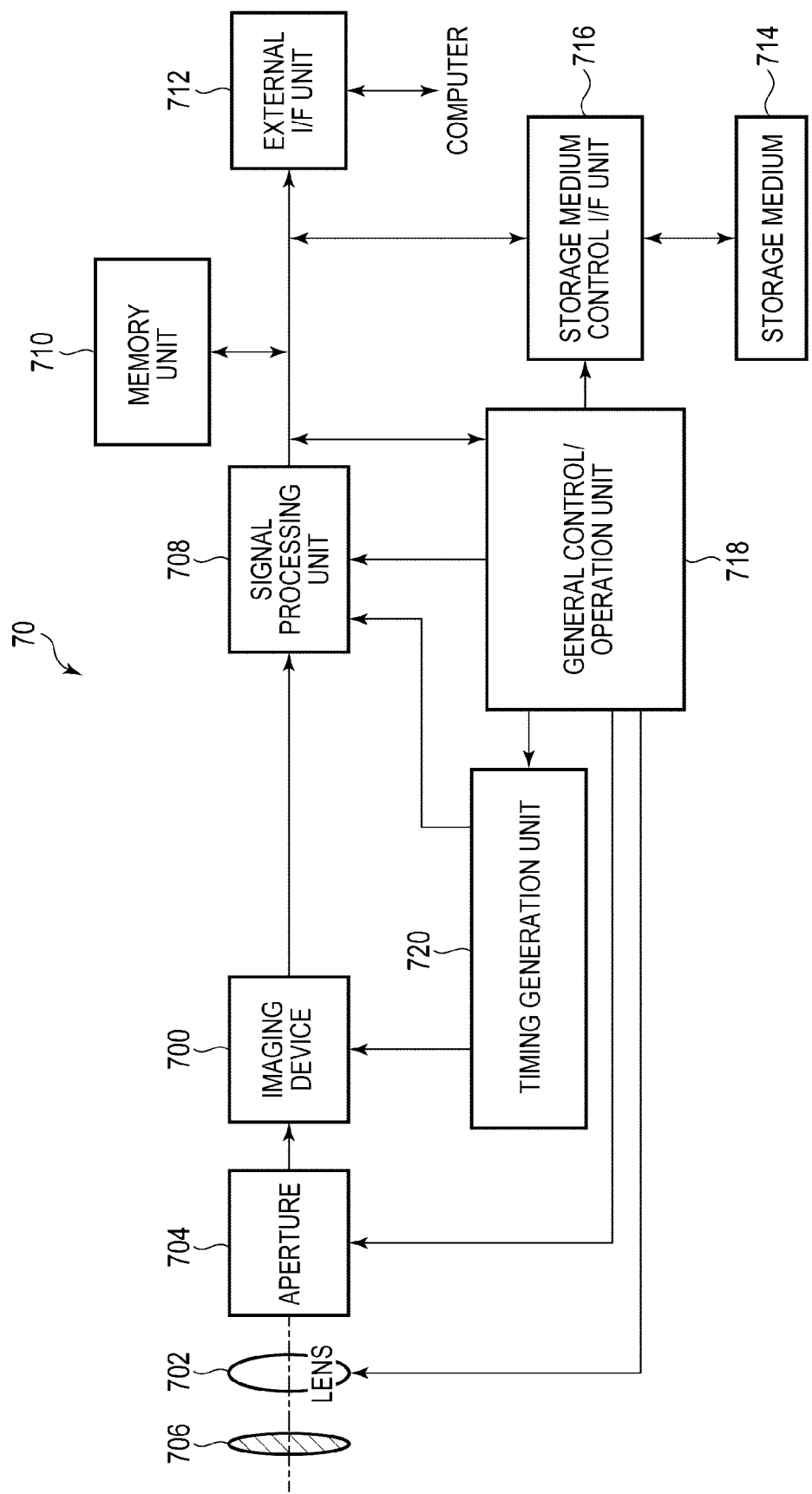
FIG. 12 is a block diagram of equipment according to a seventh embodiment.

The photoelectric conversion device of the above embodiments can be applied to various equipment. Examples of the equipment include a digital still camera, a digital camcorder, a camera head, a copying machine, a facsimile, a mobile phone, a vehicle-mounted camera, an observation satellite, and a surveillance camera. FIG. 12 is a block diagram of a digital still camera as an example of equipment.

The equipment 70 illustrated in FIG. 12 includes a barrier 706, a lens 702, an aperture 704, and an imaging device 700 (an example of the photoelectric conversion device). The equipment 70 further includes a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device corresponding to the equipment. The barrier 706 protects the lens 702, and the lens 702 forms an optical image of an object on the imaging device 700. The aperture 704 varies the amount of light passing through the lens 702. The imaging device 700 is configured as in the above embodiments, and converts an optical image formed by the lens 702 into image data (image signal). The signal processing unit 708 performs various corrections, data compression, and the like on the image data output from the imaging device 700. The timing generation unit 720 outputs various timing signals to the imaging device 700 and the signal processing unit 708. The general control/operation unit 718 controls the entire digital still camera, and the memory unit 710 temporarily stores image data. The storage medium control I/F unit 716 is an interface for storing or reading image data on the storage medium 714, and the storage medium 714 is a detachable storage medium such as a semiconductor memory for storing or reading captured image data. The external I/F unit 712 is an interface for communicating with an external computer or the like. The timing signal or the like may be input from the outside of the equipment. The equipment 70 may further include a display device (a monitor, an electronic view finder, or the like) for displaying information obtained by the photoelectric conversion device. The equipment includes at least a photoelectric conversion device. Further, the equipment 70 includes at least one of an optical device, a control device, a processing device, a display device, a storage device, and a mechanical device that operates based on information obtained by the photoelectric conversion device. The mechanical device is a movable portion (for example, a robot arm) that receives a signal from the photoelectric conversion device for operation.

Each pixel may include a plurality of photoelectric conversion units (a first photoelectric conversion unit and a second photoelectric conversion unit). The signal processing unit 708 may be configured to process a pixel signal based on charges generated in the first photoelectric conversion unit and a pixel signal based on charges generated in the second photoelectric conversion unit, and acquire distance information from the imaging device 700 to an object.

Eighth Embodiment

Figure 13A:
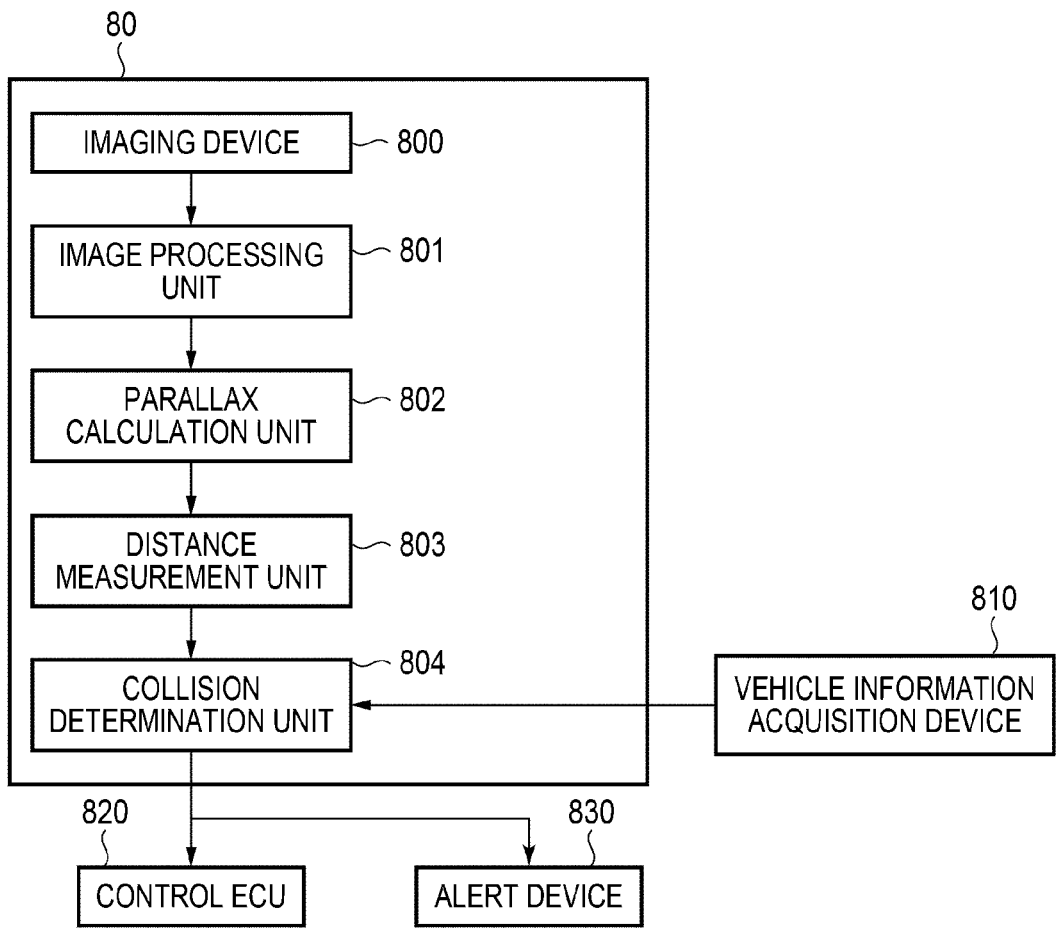
FIGS. 13A and 13B are block diagrams of equipment according to an eighth embodiment.
Figure 13B:
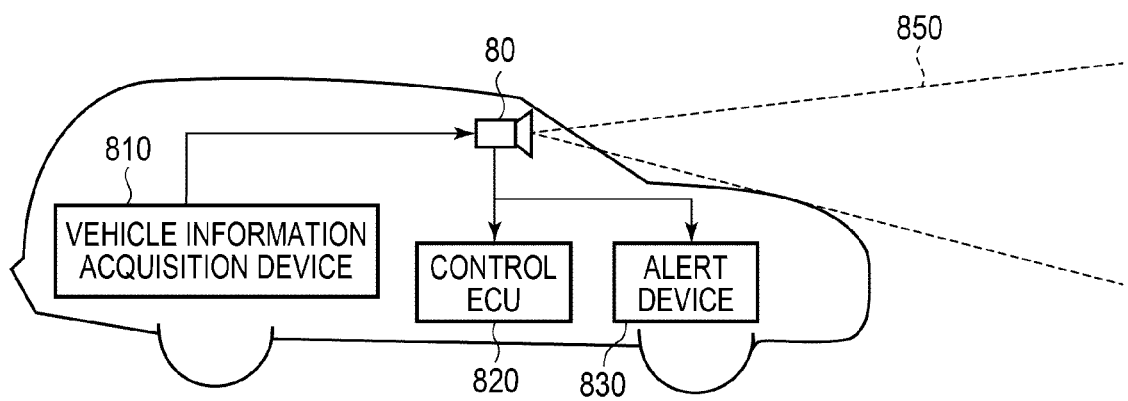

FIGS. 13A and 13B are block diagrams of equipment relating to the vehicle-mounted camera according to the present embodiment. The equipment 80 includes an imaging device 800 (an example of the photoelectric conversion device) of the above embodiments and a signal processing device (processing device) that processes a signal from the imaging device 800. The equipment 80 includes an image processing unit 801 that performs image processing on a plurality of pieces of image data acquired by the imaging device 800, and a parallax calculation unit 802 that calculates parallax (phase difference of parallax images) from the plurality of pieces of image data acquired by the equipment 80. The equipment 80 includes a distance measurement unit 803 that calculates a distance to an object based on the calculated parallax, and a collision determination unit 804 that determines whether or not there is a possibility of collision based on the calculated distance. Here, the parallax calculation unit 802 and the distance measurement unit 803 are examples of a distance information acquisition unit that acquires distance information to the object. That is, the distance information is information on a parallax, a defocus amount, a distance to the object, and the like. The collision determination unit 804 may determine the possibility of collision using any of these pieces of distance information. The distance information acquisition unit may be realized by dedicatedly designed hardware or software modules. Further, it may be realized by a field programmable gate array (FPGA), an application specific integrated circuit (ASIC) or a combination thereof.

The equipment 80 is connected to the vehicle information acquisition device 810, and can obtain vehicle information such as a vehicle speed, a yaw rate, and a steering angle. Further, the equipment 80 is connected to a control ECU 820 which is a control device that outputs a control signal for generating a braking force to the vehicle based on the determination result of the collision determination unit 804. The equipment 80 is also connected to an alert device 830 that issues an alert to the driver based on the determination result of the collision determination unit 804. For example, when the collision possibility is high as the determination result of the collision determination unit 804, the control ECU 820 performs vehicle control to avoid collision or reduce damage by braking, returning an accelerator, suppressing engine output, or the like. The alert device 830 alerts the user by sounding an alarm such as a sound, displaying alert information on a screen of a car navigation system or the like, or giving vibration to a seat belt or a steering wheel. The equipment 80 functions as a control unit that controls the operation of controlling the vehicle as described above.

In the present embodiment, an image of the periphery of the vehicle, for example, the front or the rear is captured by the equipment 80. FIG. 13B illustrates equipment in a case where an image is captured in front of the vehicle (image capturing range 850). The vehicle information acquisition device 810 as the imaging control unit sends an instruction to the equipment 80 or the imaging device 800 to perform the imaging operation. With such a configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an airplane, a satellite, an industrial robot and a consumer use robot, or the like, for example. In addition, the equipment can be widely applied to equipment which utilizes object recognition or biometric authentication, such as an intelligent transportation system (ITS), a surveillance system, or the like without being limited to movable bodies.

Modified Embodiments

The present invention is not limited to the above embodiments, and various modifications are possible. For example, an example in which some of the configurations of any one of the embodiments are added to other embodiments or an example in which some of the configurations of any one of the embodiments are replaced with some of the configurations of other embodiments are also embodiments of the present invention.

The configurations of the pixel array 10 and the pixel 100 arranged in the photoelectric conversion device are not limited to those of the above embodiments. For example, a plurality of column signal lines 13 may be arranged corresponding to pixels 100 of one column, and a plurality of selection transistors M4 may be arranged in one pixel 100. In this case, the column signal line 13 that outputs a signal can be selected by turning on any one of the plurality of selection transistors M4. Further, in this case, one buffer 26 May be shared by a plurality of column signal lines 13 of the same column.

The configuration of the pixel 100 is not limited to that illustrated in FIGS. 2 and 4. For example, one pixel 100 may include a plurality of photoelectric conversion units PD, and the plurality of photoelectric conversion units PD may share one floating diffusion FD. Further, a plurality of photoelectric conversion units PD may be arranged corresponding to one microlens. In this case, signals for ranging used for autofocusing or the like by the phase difference detection method can be acquired.

The number of semiconductor substrates in which the photoelectric conversion device according to the above embodiments is formed may be one or more semiconductor substrates. For example, in the case where elements constituting the photoelectric conversion device are separately formed in a plurality of semiconductor substrates, the plurality of semiconductor substrates may be stacked. In this case, the number of stacked semiconductor substrates may be two, or may be three or more.

These modifications are similarly applicable to the effective pixel array 10a and the light-shielded pixel array 10b of the sixth embodiment.

The disclosure of this specification includes a complementary set of the concepts described in this specification. That is, for example, if a description of "A is B" (A=B) is provided in this specification, this specification is intended to disclose or suggest that "A is not B" even if a description of "A is not B" (A≠B) is omitted. This is because it is assumed that "A is not B" is considered when "A is B" is described.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-206424, filed Dec. 23, 2022, which is hereby incorporated by reference herein in its entirety.

What is claimed is:

1. A photoelectric conversion device comprising:
a pixel;
a signal line to which a signal is output from the pixel;
a capacitive element having a first terminal and a second terminal, the first terminal being connected to the signal line;
a first control line, and
a first buffer having an input terminal connected to the first control line and having an output terminal connected to the second terminal,
wherein a variable potential is applied to the second terminal due to a change in a potential of the first control line.

2. A photoelectric conversion device comprising:
a pixel;
a signal line to which a signal is output from the pixel;
a capacitive element having a first terminal and a second terminal, the first terminal being connected to the signal line; and
a first control line,
wherein a variable potential is applied to the second terminal due to a change in a potential of the first control line,
wherein the pixel includes a photoelectric conversion unit, a floating diffusion, and a transfer transistor configured to transfer charges from the photoelectric conversion unit to the floating diffusion, and
wherein a potential applied to the second terminal changes at a timing when the transfer transistor transitions from on state to off state.

3. The photoelectric conversion device according to claim 2, wherein the first control line is connected to the second terminal.

4. The photoelectric conversion device according to claim 2,
wherein the pixel further includes a reset transistor configured to reset a potential of the floating diffusion, and
wherein the potential applied to the second terminal changes at a timing when the reset transistor transitions from on state to off state.

5. The photoelectric conversion device according to claim 2,
wherein the pixel further includes a capacitance switching transistor configured to change a capacitance of the floating diffusion, and
wherein the potential applied to the second terminal changes at a timing when the capacitance switching transistor transitions from on state to off state.

6. A photoelectric conversion device comprising:
a pixel;
a signal line to which a signal is output from the pixel;
a capacitive element having a first terminal and a second terminal, the first terminal being connected to the signal line; and
a first control line, wherein a variable potential is applied to the second terminal due to a change in a potential of the first control line, wherein a plurality of the pixels are arranged to form a plurality of columns, wherein the signal line and the capacitive element are arranged corresponding to each of the plurality of columns, wherein the plurality of columns includes a first column and a second column, wherein a variable potential is applied to the second terminal of the capacitive element of the first column due to the change in the potential of the first control line, and wherein a potential corresponding to a potential of a wiring different from the first control line is applied to the second terminal of the capacitive element of the second column.

7. The photoelectric conversion device according to claim 6, wherein the wiring different from the first control line is a second control line whose potential changes, and wherein a variable potential is applied to the second terminal of the capacitive element of the second column due to a change in a potential of the second control line.

8. The photoelectric conversion device according to claim 7, wherein the potential of the first control line and the potential of the second control line are different from each other.

9. The photoelectric conversion device according to claim 6, wherein the wiring different from the first control line has a fixed potential, and wherein the fixed potential is applied to the second terminal of the capacitive element of the second column.

10. The photoelectric conversion device according to claim 6 further comprising:

a first buffer having an input terminal connected to the first control line and having an output terminal connected to the second terminal of the capacitive element of the first column; and a second buffer having an input terminal connected to the wiring different from the first control line and having an output terminal connected to the second terminal of the capacitive element of the second column.

11. The photoelectric conversion device according to claim 10, wherein the first buffer and the second buffer have the same circuit configuration.

12. The photoelectric conversion device according to claim 6, wherein the pixel in the first column is an effective pixel including a photoelectric conversion unit configured to output a signal corresponding to incident light by photoelectric conversion, and wherein the pixel in the second column is a light-shielded pixel including the photoelectric conversion unit that is light-shielded.

13. The photoelectric conversion device according to claim 6 further comprising a comparator arranged corresponding to each of the plurality of columns and having a first input terminal, a second input terminal, and an output terminal, wherein an analog signal is input to the first input terminal from the signal line, wherein a reference signal that varies according to time is input to the second input terminal, and wherein the comparator compares a potential of the first input terminal with a potential of the second input terminal to output a signal indicating a comparison result from the output terminal.

14. The photoelectric conversion device according to claim 13, wherein the comparator has a function of clamping a potential input to the first input terminal and a potential input to the second input terminal, and wherein a potential applied to the second terminal changes before the reference signal starts to vary and before the clamping is performed.

15. The photoelectric conversion device according to claim 1, wherein the potential applied to the second terminal is either a first potential or a second potential different from the first potential.

16. The photoelectric conversion device according to claim 15, wherein the first potential is a ground potential, and wherein the second potential is a power supply potential.

17. The photoelectric conversion device according to claim 15, wherein at least one of the first potential and the second potential is a potential between a ground potential and a power supply potential.

18. The photoelectric conversion device according to claim 1, wherein the potential applied to the second terminal is continuously variable.

19. Equipment comprising:

the photoelectric conversion device according to claim 1; and at least any one of:

an optical device adapted for the photoelectric conversion device, a control device configured to control the photoelectric conversion device, a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

20. The equipment according to claim 19, wherein the processing device processes image signals that are generated by a plurality of photoelectric conversion units, respectively, and acquires distance information on a distance from the photoelectric conversion device to an object.

21. Equipment comprising:

the photoelectric conversion device according to claim 4; and at least any one of:

an optical device adapted for the photoelectric conversion device, a control device configured to control the photoelectric conversion device, a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

22. The equipment according to claim 21, wherein the processing device processes image signals that are generated by a plurality of photoelectric conversion units, respectively, and acquires distance information on a distance from the photoelectric conversion device to an object.

23. Equipment comprising:
   the photoelectric conversion device according to claim 6; and
   at least any one of:
      an optical device adapted for the photoelectric conversion device,
      a control device configured to control the photoelectric conversion device,
      a processing device configured to process a signal output from the photoelectric conversion device,
      a display device configured to display information obtained by the photoelectric conversion device,
      a storage device configured to store information obtained by the photoelectric conversion device, and
      a mechanical device configured to operate based on information obtained by the photoelectric conversion device.

24. The equipment according to claim 23, wherein the processing device processes image signals that are generated by a plurality of photoelectric conversion units, respectively, and acquires distance information on a distance from the photoelectric conversion device to an object.

* * * * *